(12) United States Patent
van der Kouwe et al.

(10) Patent No.: US 7,602,179 B2
(45) Date of Patent: Oct. 13, 2009

(54) SYSTEM AND METHOD FOR MULTI-ECHO BANDWIDTH MATCH IMAGING

(75) Inventors: Andre van der Kouwe, Woburn, MA (US); Bruce Fischl, Cambridge, MA (US)

(73) Assignee: The General Hospital Corporation, Boston, MA (US)

(*) Notice: Subject to any disclaimer, the term of this patent is extended or adjusted under 35 U.S.C. 154(b) by 177 days.

(21) Appl. No.: 11/562,879

(22) Filed: Nov. 22, 2006

(65) Prior Publication Data

US 2008/0116891 A1    May 22, 2008

(51) Int. Cl.
 *G01V 3/00* (2006.01)
(52) U.S. Cl. ...................................... 324/307
(58) Field of Classification Search ................... 324/307
 See application file for complete search history.

(56) References Cited

U.S. PATENT DOCUMENTS

| 5,245,282 | A | | 9/1993 | Mugler, III et al. |
| 5,347,216 | A | | 9/1994 | Foo |
| 5,545,990 | A | * | 8/1996 | Kiefer et al. ................. 324/307 |
| 7,106,060 | B2 | * | 9/2006 | Hennig ........................ 324/309 |

* cited by examiner

*Primary Examiner*—Brij B. Shrivastav
*Assistant Examiner*—Megann E Vaughn
(74) *Attorney, Agent, or Firm*—Quarles & Brady LLP

(57) ABSTRACT

A system and method for medical imaging includes an improvement to the MP-RAGE pulse sequence that enables the readout bandwidth thereof to be matched to that of other pulse sequences used in the same examination without a significant loss in SNR. More specifically, the present invention includes using a multi-echo MP-RAGE pulse sequence in which multiple gradient-recalled NMR signals are acquired at the desired "matching" bandwidth and combining selected ones of the NMR signals to reconstruct an image. By selecting and combining NMR signals acquired at each phase encoding, the SNR of the resulting reconstructed image can be maintained.

13 Claims, 5 Drawing Sheets

SYSTEM AND METHOD FOR MULTI-ECHO BANDWIDTH MATCH IMAGING

BACKGROUND OF THE INVENTION

The field of the invention is nuclear magnetic resonance imaging methods and systems. More particularly, the invention relates to a system and method for multi-echo bandwidth matched imaging processes.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, Mz, may be rotated, or "tipped", into the x-y plane to produce a net transverse magnetic moment Mt.

The practical value of this phenomenon resides in the signal, which is emitted by the excited spins after the excitation signal $B_1$ is terminated. In simple systems, the excited spins induce an oscillating sine wave signal in a receiving coil. The frequency of this signal is the Larmor frequency, and its initial amplitude, $A_0$, is determined by the magnitude of the transverse magnetic moment $M_t$. The resulting set of received NMR signals are digitized and processed to reconstruct the image using one of many well-known reconstruction techniques.

The amplitude, A, of the emission signal decays in an exponential fashion with time, t. The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field. The practical value of the $T_2$ constant is that tissues have different $T_2$ values and this can be exploited as a means of enhancing the contrast between such tissues.

Another important factor which contributes to the amplitude A of the NMR signal is referred to as the spin-lattice relaxation process that is characterized by the time constant $T_1$. It describes the recovery of the net magnetic moment M to its equilibrium value along the axis of magnetic polarization (z). The $T_1$ time constant is longer than $T_2$, much longer in most substances of medical interest. As with the $T_2$ constant, the difference in $T_1$ between tissues can be exploited to provide image contrast.

When utilizing NMR to produce images, a technique is employed to obtain NMR signals from specific locations in the subject. Typically, the region that is to be imaged (region of interest) is scanned by a sequence of NMR measurement cycles that vary according to the particular localization method being used. The resulting set of received NMR signals are digitized and processed to reconstruct the image using one of many well-known reconstruction techniques. To perform such a scan, it is, of course, necessary to elicit NMR signals from specific locations in the subject. This is accomplished by employing magnetic fields ($G_x$, $G_y$, and $G_z$) that have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

The time required to acquire sufficient NMR signals to reconstruct an image is an important consideration, since reduced scan time increases patient throughput, improves patient comfort, and improves image quality by reducing motion artifacts. There is a class of pulse sequences that have a very short repetition time (TR) and result in complete scans that can be conducted in seconds rather than minutes.

The concept of acquiring NMR imaging data in a short time period has been known since 1977 when the echo-planar pulse sequence was proposed by Peter Mansfield (J. Phys. C. 10: L55-L58, 1977). In contrast to standard pulse sequences, the echo-planar pulse sequence produces a series of gradient-recalled NMR echo signals for each RF excitation pulse. These NMR signals are separately phase encoded so that a set of views sufficient to reconstruct an image can be acquired in a single pulse sequence of 20 to 100 milliseconds in duration. The advantages of echo-planar imaging ("EPI") are well known.

A variant of the echo-planar imaging method is the Rapid Acquisition Relaxation Enhanced (RARE) sequence which is described by J. Hennig et al in an article in Magnetic Resonance in Medicine 3,823-833 (1986) entitled "RARE Imaging: A Fast Imaging Method for Clinical MR." The primary difference between the RARE sequence and the EPI sequence lies in the manner in which NMR echo signals are produced. The RARE sequence, utilizes RF refocused echoes generated from a Carr-Purcell-Meiboom-Gill sequence, while EPI methods employ gradient recalled echoes.

Both of these "fast spin echo" imaging methods involve the acquisition of multiple echo signals from a single excitation pulse in which each acquired echo signal is separately phase encoded. Each pulse sequence, or "shot", therefore results in the acquisition of a plurality of views and single shot scans are commonly employed with the EPI method. However, a plurality of shots is typically employed to acquire a complete set of image data when the RARE fast spin echo sequence is employed. For example, a RARE pulse sequence might acquire 8 or 16 separate echo signals, per shot, and an image requiring 256 views would, therefore, require 32 or 16 shots, respectively.

Pulse sequences based on spin echo, RARE, and EPI often employ pulse sequences with a preparatory pulse followed by a time delay prior to the imaging pulse sequence RF excitation. One such pulse sequence is referred to as an inversion recovery (IR) pulse sequence. The time delay between the inversion RF pulse and the RF excitation pulse is referred to as the inversion time (TI). Conceptually, an IR pulse sequence includes a first portion, referred to as the "IR module," that includes the preparatory pulse, an optional spoiler gradient, and any slice-selection gradient (should the preparatory pulse be selective). The second portion of the IR pulse sequence, referred to as the "host sequence," begins after the TI interval and typically includes a self-contained pulse sequence, such as a spin-echo sequence, gradient echo sequence, RARE sequence, EPI sequence, or the like.

Spin echo, RARE, and EPI pulse sequences often include an IR module for each host sequence. However, when fast gradient echo sequences are employed, the short TR does not allow time for a full IR module to be included before each imaging pulse sequence. As described by J. P. Mugler et al in "Three-Dimensional Magnetization-Prepared Rapid Gradient-Echo Imaging (3D MP RAGE)," Magnetic Resonance In Medicine 15, 152-157 (1990); by M. Brant-Zawadzki in "MP RAGE: A Three-Dimensional, T1-Weighted, Gradient-Echo Sequence—Initial Experience in the Brain," Radiology 1992; 182: 769-775; and by J. P. Mugler et al. in "T2-Weighted Three-Dimensional MP-RAGE MR Imaging," JMRI 1991:

1:731-737; a plurality of gradient-echo pulse sequence can be performed after each IR module. In particular, for $T_1$-weighted imaging, a non-selective preparatory pulse (having an angle selected from 0 to 180 degrees) is applied and followed by a TI interval. After the TI interval, a series of fast gradient-recalled echo sequences are performed to acquire a corresponding series of phase-encoded lines in k-space. Following a recovery period, the process is repeated as necessary to fully sample k-space.

A common practice when using MR images in a clinical setting is to register and combine images produced using different pulse sequences. These different images each provide different tissue contrasts and their combination provides the necessary tissue contrast between all of the clinically important tissue types in the volume of interest. In multi-spectral brain morphometry, for example, an MP-RAGE image, a multi-echo FLASH image, and a fast spin echo (FSE) image may be acquired and registered with each other to examine the edges of small structures in the brain. Due to $B_0$ field inhomogeneities in the MRI system, however, all of these different images should be acquired at the same signal readout bandwidth so that distortions due to the $B_0$ inhomogeneity will be identical in all the images and they can be precisely registered with each other. A limitation of the MP-RAGE pulse sequence is that when its readout bandwidth is increased to match those of other pulse sequences, the signal-to-noise ratio ("SNR") of the acquired NMR echo signal is reduced to an unacceptable low level.

SUMMARY OF THE INVENTION

The present invention is an improvement to the MP-RAGE pulse sequence that enables the readout bandwidth thereof to be matched to that of other pulse sequences used in the same examination without a significant loss in SNR. More specifically, the present invention includes using a multi-echo MP-RAGE pulse sequence in which multiple gradient-recalled NMR signals are acquired at the same phase encoding and at the desired "matching" bandwidth. Selected ones of the NMR signals at each phase encoding are combined and used to reconstruct an image. By selecting and combining NMR signals acquired at each phase encoding, the SNR of the resulting reconstructed image can be maintained.

A general feature of the invention is produce an MP-RAGE image that can be precisely aligned, or registered, with other images acquired in the examination. This is accomplished by acquiring the NMR signals at a bandwidth matched with the bandwidths used by other image pulse sequences in the examination. By acquiring multiple NMR signals with the MP-RAGE pulse sequence, these can be selectively combined to provide the desired image SNR. In addition, the selection and combining steps can be used to adjust the effective $T_2$ contrast of the MP-RAGE image to provide the needed contrast between tissue types.

Various other features of the present invention will be made apparent from the following detailed description and the drawings.

DESCRIPTION OF THE PREFERRED EMBODIMENT

Figure 1:
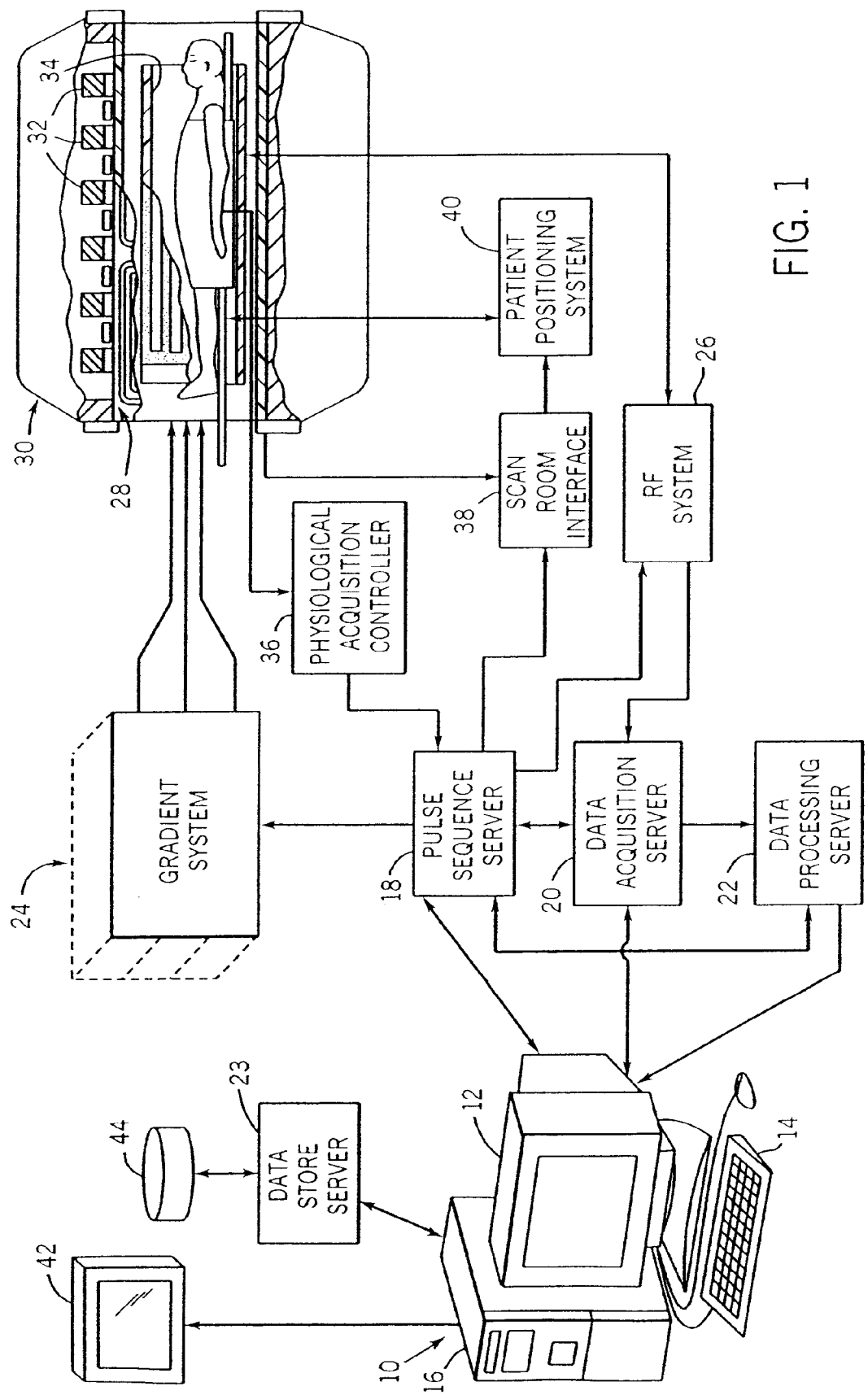
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface that enables scan prescriptions to be entered into the MRI system.

The workstation 10 is coupled to four servers: a pulse sequence server 18; a data acquisition server 20; a data processing server 22, and a data store server 23. In the preferred embodiment, the data store server 23 is performed by the workstation processor 16 and associated disc drive interface circuitry. The server 18 is performed by a separate processor and the servers 20 and 22 are combined in a single processor. The workstation 10 and each processor for the servers 18, 20 and 22 are connected to an Ethernet communications network. This network conveys data that is downloaded to the servers 18, 20 and 22 from the workstation 10, and it conveys data that is communicated between the servers.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$, and $G_z$ used for position encoding NMR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2} \qquad (1),$$

and the phase of the received NMR signal may also be determined:

$$\Phi = \tan^{-1} Q/I \quad (2).$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate" the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized NMR signal samples produced by the RF system 26 are received by the data acquisition server 20. The data acquisition server 20 operates in response to instructions downloaded from the workstation 10 to receive the real-time NMR data and provide buffer storage such that no data is lost by data overrun. In some scans, the data acquisition server 20 does little more than pass the acquired NMR data to the data processor server 22. However, in scans that require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which the k-space is sampled. And, the data acquisition server 20 may be employed to process NMR signals used to detect the arrival of a contrast agent in an MRA scan. In all these examples, the data acquisition server 20 acquires NMR data and processes it in real-time to produce information which is used to control the scan.

The data processing server 22 receives NMR data from the data acquisition server 20 and processes it in accordance with instructions downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real-time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
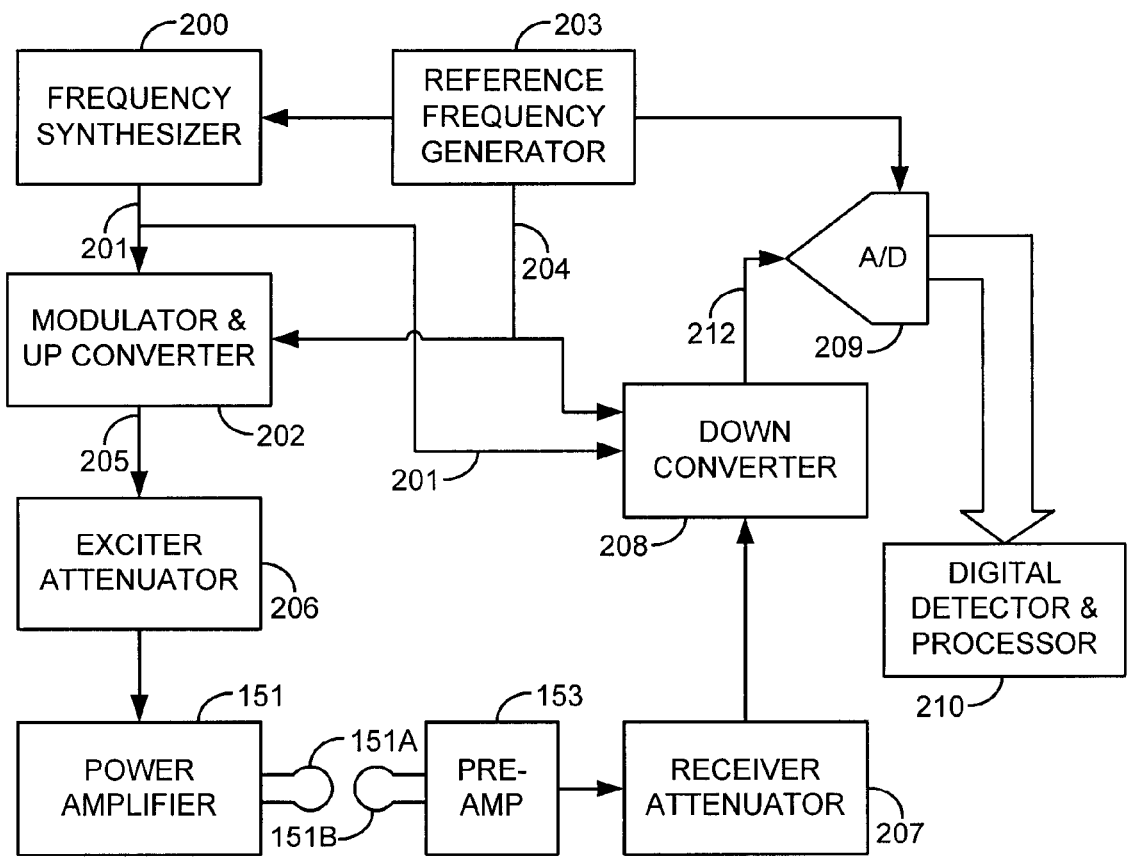
FIG. 2 is a block diagram of a transceiver which forms part of the MRI system of FIG. 1.

As shown in FIG. 1, the RF system 26 may be connected to the whole body rf coil 34, or as shown in FIG. 2, a transmitter section of the RF system 26 may connect to one rf coil 152A and its receiver section may connect to a separate RF receive coil 152B. Often, the transmitter section is connected to the whole body RF coil 34 and each receiver section is connected to a separate local coil 152B.

Referring particularly to FIG. 2, the RF system 26 includes a transmitter that produces a prescribed RF excitation field. The base, or carrier, frequency of this RF excitation field is produced under control of a frequency synthesizer 200 that receives a set of digital signals from the pulse sequence server 18. These digital signals indicate the frequency and phase of the RF carrier signal produced at an output 201. The RF carrier is applied to a modulator and up converter 202 where its amplitude is modulated in response to a signal R(t) also received from the pulse sequence server 18. The signal R(t) defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 205 is attenuated by an exciter attenuator circuit 206 that receives a digital command from the pulse sequence server 18. The attenuated RF excitation pulses are applied to the power amplifier 151 that drives the RF coil 152A. For a more detailed description of this transmitter section reference is made to U.S. Pat. No. 4,952,877 that is incorporated herein by reference.

Referring still to FIG. 2, the signal produced by the subject is picked up by the receiver coil 152B and applied through a preamplifier 153 to the input of a receiver attenuator 207. The receiver attenuator 207 further amplifies the signal by an amount determined by a digital attenuation signal received from the pulse sequence server 18. The received signal is at or around the Larmor frequency, and this high frequency signal is down converted in a two-step process by a down converter 208 that first mixes the NMR signal with the carrier signal on line 201 and then mixes the resulting difference signal with a reference signal on line 204. The down converted NMR signal is applied to the input of an analog-to-digital (A/D) converter 209 that samples and digitizes the analog signal and applies it to a digital detector and a signal processor 210 that produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 are produced by a reference frequency generator 203. For a more detailed description of the receiver, reference is made to U.S. Pat. No. 4,992,736 that is incorporated herein by reference.

Figure 3:
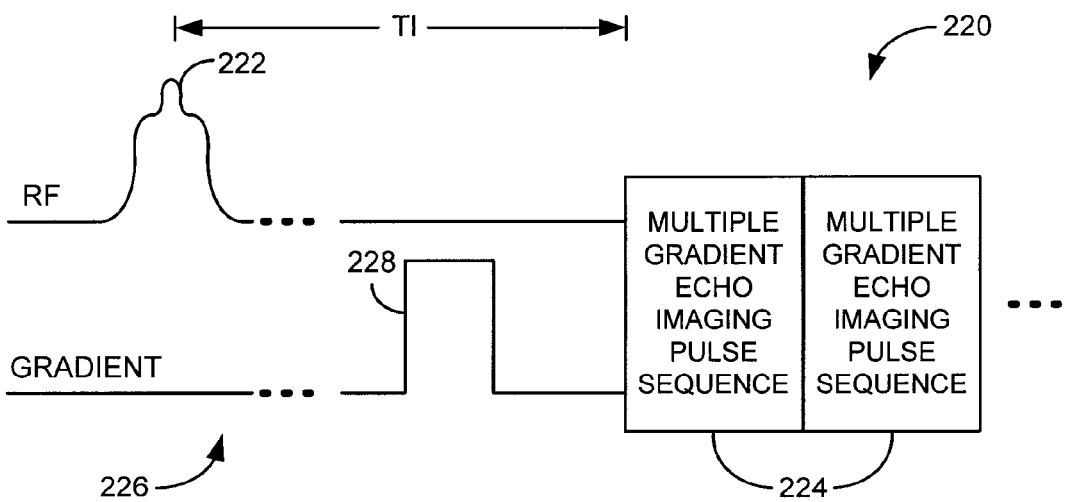
FIG. 3 is a schematic representation of a method for acquiring MRI data in accordance with the present invention using the systems of FIGS. 1 and 2.

Referring now to FIG. 3, the present invention employs a pulse sequence 220 that can be used in connection with the above scanning steps. In particular, the pulse sequence 220 includes a contrast preparation sequence 226 followed by one or more multiple gradient echo imaging pulse sequences 224. The contrast preparation pulse sequence 226 includes a spectrally selective RF inversion pulse 222 that is produced at a time interval (TI) before the commencement of the imaging pulse sequences 224. The contrast preparation sequence 226 may also include a gradient pulse 228 that serves to dephase the transverse magnetization produced by the inversion pulse 222. As is well known in the art, the interval TI is selected to prepare this longitudinal magnetization to provide a prescribed TI weighting to the image data acquired with the imaging pulse sequences 224.

Figure 4:
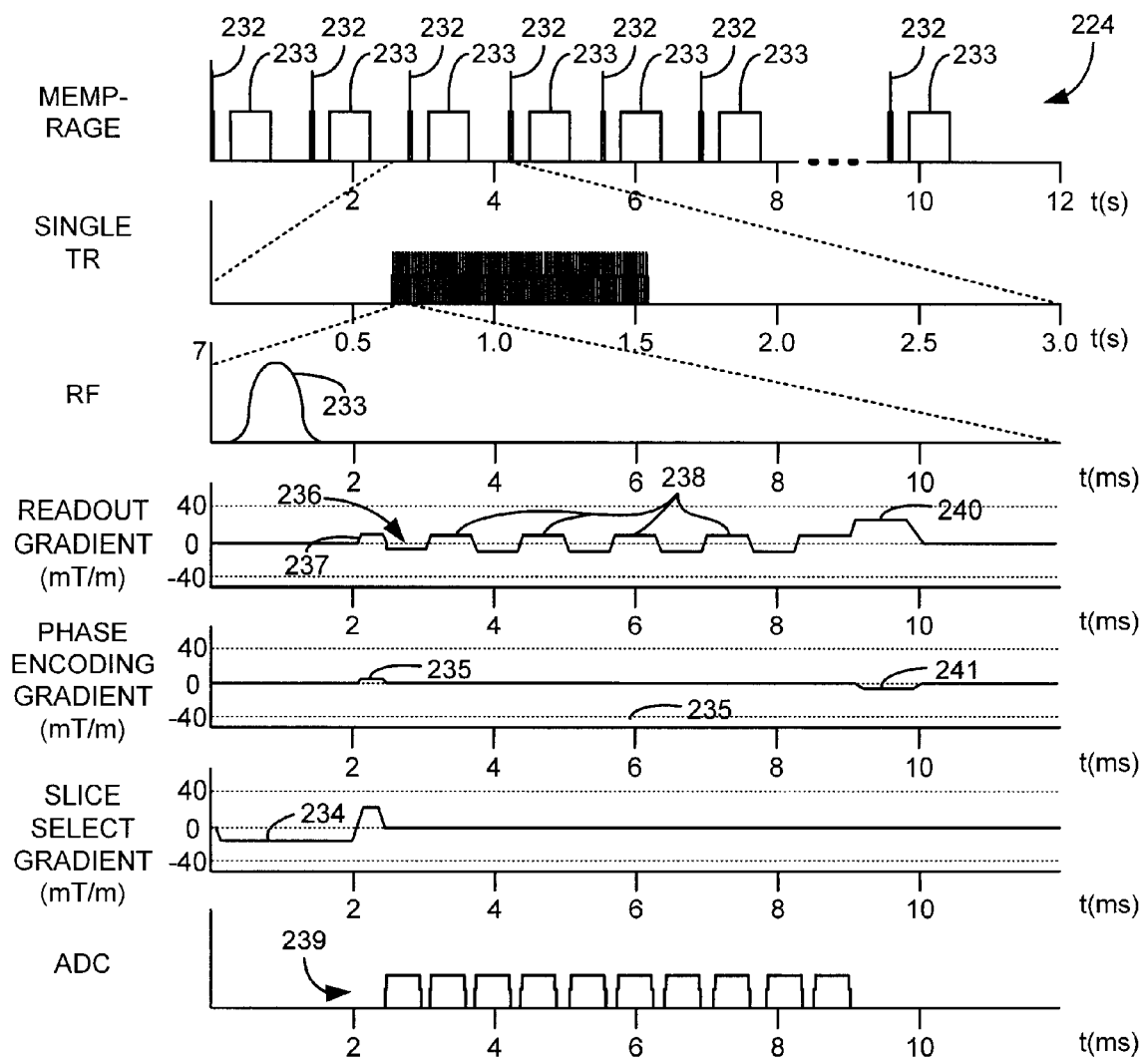
FIG. 4 is a detailed pulse sequence diagram for a multi-echo magnetization prepared rapid acquisition gradient echo pulse sequence employed in the method of FIG. 3.

Referring to FIG. 4, each image pulse sequence 220 is a multi-echo, rapid acquisition gradient echo pulse sequence that includes an RF inversion pulse 232 followed by a series of RF excitation pulses indicated generally at 233, each producing a series of gradient recalled echo signals. As will be described below, each image pulse sequence 224 is phase encoded once such that it acquires only a single "view", however, it acquires multiple copies of that view. As a result, the imaging pulse sequence 224 is repeated once for each phase encoding value needed to acquire a complete k-space image data set. Typically, the imaging pulse sequence 224 is repeated a number of times equal to the number of phase encoding steps after the preparatory (inversion) pulse sequence 226 and the entire sequence 220 is repeated until the k-space is filled. At each phase encoding step, a number of echoes from 1 to 12 or more are generated. The pulse sequence is a multiple-echo MP-RAGE pulse sequence, which is referred to hereinafter as an "MEMP-RAGE" pulse sequence.

Figure 5:
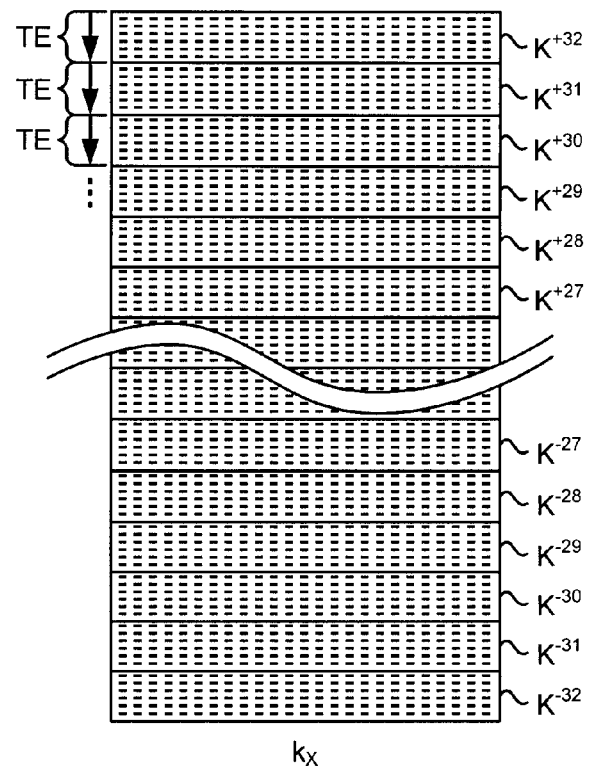
FIG. 5 is an illustration of k-space lines filled using the pulse sequence of FIG. 4.

Referring still to FIG. 4, each imaging pulse sequence 224 includes a selective RF excitation pulse 233 generated in the presence of a slice select gradient 234 to produce transverse magnetization in a prescribed slice. This is followed by a phase encoding pulse 235 that imparts a phase corresponding to the k-space view being acquired. A readout gradient pulse train 236 is then generated, which includes a prephasing lobe 237 followed by a series of alternating readout lobes 238. A corresponding series of gradient-recalled NMR echo signals are acquired as indicated at 239. All of the NMR echo signals acquired by this preferred embodiment of the imaging pulse sequence 220 sample the same line in k-space, with the odd numbered signals sampling in one direction and the even numbered signals sampling in the other direction. That is, as illustrated in FIG. 5, all of the NMR echo signals acquired using the imaging pulse sequence sample the same line in k-space along $k_x$ for each phase encoding. Accordingly, odd numbered signals are sampled along one direction across the line of k-space and even numbered signals are sampled along the opposite direction across the line of k-space. This continues until a spoiler gradient 240 is applied on the readout gradient, which is coordinated with a rephaser pulse 241 applied on the phase encoding gradient. As a result, this imaging pulse sequence 220 acquires a series of NMR echo signals at the same phase encoding but at different echo times (TE), for example the set of lines corresponding to $K^{+32}$. Therefore, as illustrated in FIG. 5, the same line of k-space is sampled along $k_x$, each of which is distinguished by differing echo times. The echo times TE typically range from 0.5 ms to 10 ms (or longer) and provide a wide range of $T_2$ contrast control. Once the prescribed number of NMR echo signals is acquired, the above-described pulse sequence 224 is again applied with a new phase encoding gradient 235 to acquire another set of k-space lines. This process is repeated until all k-space lines $K^{+32}$ through $K^{-32}$ are acquired.

By acquiring multiple NMR echo signals at the same phase encoding and at different echo times (TE), many variations are possible in the image that can be reconstructed from this acquired image data. For example, this imaging pulse sequence allows multiple high bandwidth lines with shorter readout to be collected in the same time that would be required to collect lower bandwidth lines with longer readout when using the traditional MP-RAGE pulse sequence. This greater flexibility in the choice of bandwidth enables bandwidth matching between various sequence types, without compromising SNR. Since the contrast of the final image is a function of the inversion time (TI), delay time (TD), echo train length, repetition time (TR), and flip angle of the RF excitation pulse 233, the contrast of the final image can be preserved by choosing the readout gradient echo train length, number of echoes and flip angle of the imaging pulse sequence 224 to match those of a contrast-optimal MP-RAGE pulse sequence, even though the bandwidth is higher. The multiple echoes are combined to provide a root mean squared (RMS) or linear combination slice image wherein the SNR lost due to the higher bandwidth is regained from the combination of echoes.

Furthermore, bandwidth matching can be extended to other pulse sequence types. For example, it is contemplated that the imaging pulse sequence 224, multi-echo FLASH (MEF), and $T_2$-Siemens fast spin echo ($T_2$-SPACE or TSE) can all be bandwidth matched. In particular, by collecting two or more flip angles of the MEF pulse sequence, $T_1$ and proton density (PD) can be estimated for each voxel of the volume using the steady-state equation for the FLASH signal intensity. In this case, a lower flip angle is more PD weighted and a high flip angle is more $T_1$ weighted. Furthermore, $T_2^*$ is estimated by fitting the decay across the echoes of the MEF. This estimate for $T_2^*$ is improved by increasing the TR and number of echoes. Additionally, $T_2^*$ can be estimated from the series of echoes collected using the imaging pulse sequence 224. Quantitative PD, $T_1$ and $T_2^*$ values can, therefore, be estimated using this protocol. The $T_2$-SPACE sequence provides $T_2$ weighted contrast, though not quantitative $T_2$ values.

For multi-spectral brain morphometry, the bandwidths of the pulse sequence 220, a multi-echo MEF pulse sequence, and a $T_2$-SPACE pulse sequence can all be matched at various anatomical resolutions while controlling the loss in SNR caused by the bandwidth matching. In fact, the bandwidth matching can be controlled to induce the same or similar distortions between scan types so that the resulting images with different contrasts can be aligned with one another. This ability is particularly valuable for brain morphometry, where the edges of small structures may be distinguished based on differences in more than one contrast, provided that the images are well aligned. The ability to create a bandwidth-matched MPRAGE/MEF/$T_2$-SPACE combination by using the above-described MEMP-RAGE pulse sequence in place of the MP-RAGE pulse sequence enables the creation of proton density (PD), $T_1$, $T_2$, and $T_2^*$ maps that are registered with one another.

Third, by selectively combining NMR echo signals acquired at different echo times (TE), an image can be reconstructed therefrom that emphasizes or reduces the contrast between chosen anatomical structures. For example, the conventional MP-RAGE protocol used for brain morphometry results in equal signal intensity between dura and cortex, which are two structures that are, in some locations, adjacent to one another (e.g. entorhinal cortex).

Using the present invention NMR echo signals may be chosen such that an image can be reconstructed that emphasizes one of these structures over the other. The result is an image that contrasts the two structures rather than blending them together. For example, in the inferior region of the entorhinal cortex (ERC), adjacent to the tentorium, cortex and dura run close to one another. There is little contrast (intensity difference) between these two tissue types when performing imaging using a traditional MP-RAGE pulse sequence, even when the parameters are optimized for gray-white-CSF contrast. However, dura has a considerably shorter $T_2^*$ than cortex. Therefore, at high bandwidths, imaging using an MP-RAGE pulse sequence with short TE value will result in the dura appearing brighter, while imaging using an MP-RAGE pulse sequence with longer TE value will result in the dura being undistinguished in the resulting image. Even when imaging with optimized parameters, since both the dura and cortex are thin sheets, the automated software designed to identify the cortex frequently incorrectly identifies portions of the dura as cortex.

Using the present invention, a number of images can be reconstructed by electing and combining different NMR echo signals until the desired contrast between these structures is achieved. The proper identification of dura is problematic for many cortical segmentation algorithms. The present method for imaging and identifying dura and eliminating it from the detected cortical ribbon is advantageous in overcoming this limiting factor in such segmentation algorithms. Since the data acquired using the above-described MEMP-RAGE pulse sequence can be bandwidth matched and SNR controlled, as described above, to be similar to images acquired using traditional MP-RAGE, which are conventionally used for brain morphometry, the above-described dura correction can be implemented at little additional cost. More specifically, the effective echo time (TE) of the imaging data acquired by the MEMP-RAGE pulse sequence can be easily changed by merely changing the selected echo signals that are combined to form the image k-space data set. It is also contemplated that MEF can be used to distinguish dura from cortex. Furthermore, other tissues such as fat and skull may also be identified in a manner similar to the above-described method for distinguishing dura when imaging the cortex.

Figure 6:
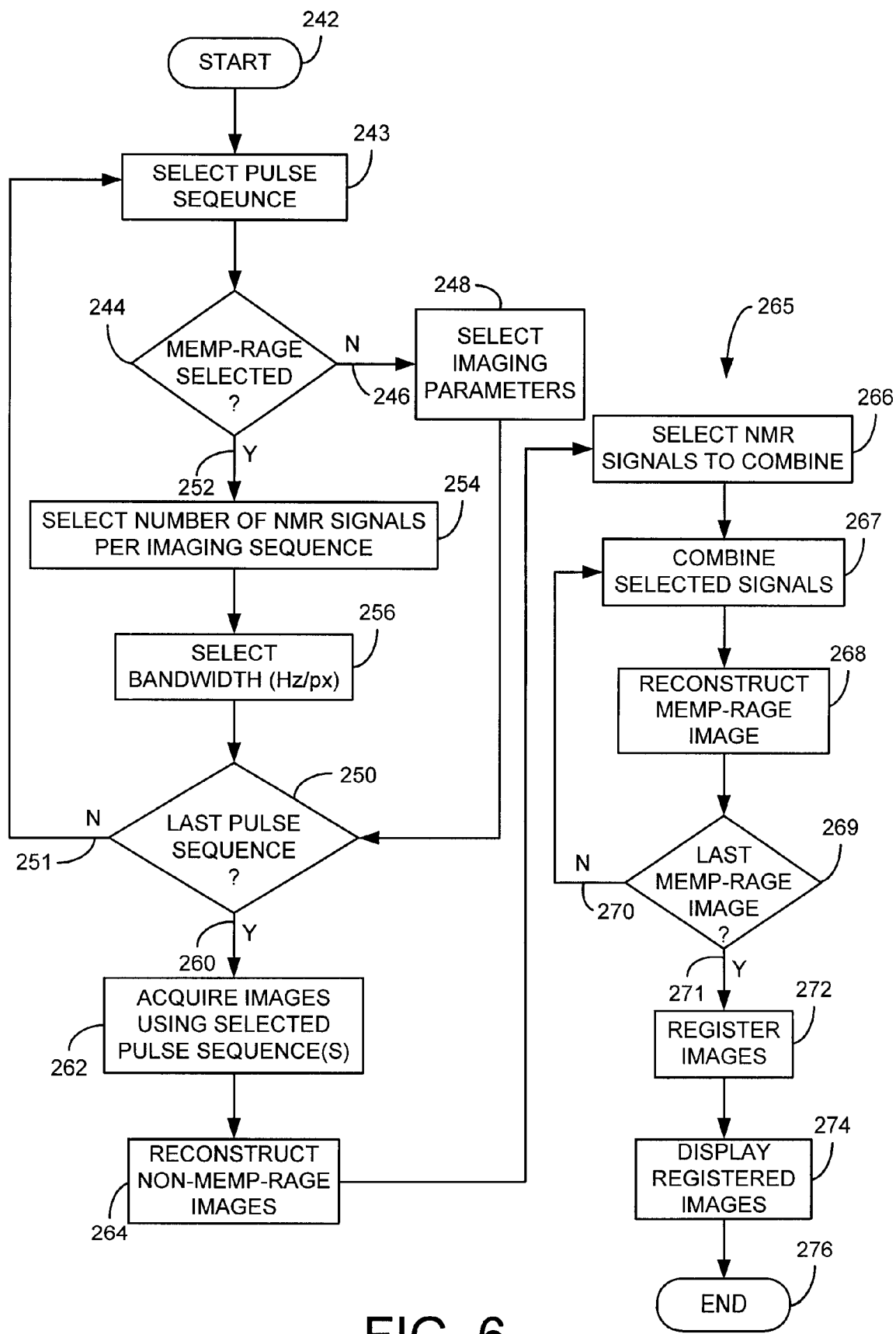
FIG. 6 is a flow chart setting forth the steps for performing an imaging process using the method of FIG. 3 and the pulse sequence of FIG. 4.

Referring now to FIG. 6, to perform a scan using the above-described MEMP-RAGE pulse sequence, the process starts at 242 with the selection of an imaging protocol by selecting a pulse sequence 243. As addressed above, the imaging protocol may include a number of pulse sequences such as the present invention (referred to as MEMP-RAGE), MEF, $T_2$-SPACE, or even traditional MP-RAGE pulse sequences. A determination is made at decision block 244 to determine whether an MEMP-RAGE pulse sequence is the pulse sequence selected at process block 243. If the pulse sequence selected at process block 243 is not an MEMP-RAGE pulse sequence 246, for example, only MEF or $T_2$-SPACE pulse sequences are used in the selected protocol, the parameters for the imaging protocol are entered at 248 and a determination is made at decision block 250 to determine whether the pulse sequence is the last pulse sequence to be entered. If the pulse sequence selected at process block 243 is not the last desired pulse sequence 251, the process repeats and the user selects another pulse sequence at process block 243.

If the pulse sequence selected at process block 243 is an MEMP-RAGE pulse sequence 252, the number of NMR echo signals to be acquired in each imaging pulse sequence is selected at process block 254. In this case, if only a single echo is to be acquired, a traditional MP-RAGE pulse sequence is used in the scan. On the other hand, should more than one echo be desired, for example, two to twelve echoes, an MEMP-RAGE pulse sequence according to the present invention is used. In the latter case, the bandwidth desired for bandwidth matching is selected in hertz per pixel (Hz/px) at 256. As addressed above, the bandwidth selected at 256 allows for adjusting the acquired data to be matched across other pulse sequences that have been selected at 243. For example, the bandwidth of multi-echo FLASH or $T_2$-SPACE pulse sequences may be matched, which results in the distortions due to $B_0$ inhomogeneities being equal across the acquired images in the scan.

Once the bandwidth has been selected at process block 256, a determination is again made at decision block 250 to determine whether the pulse sequence selected at 243 is the last desired pulse sequence. If so, the scan is initiated as indicated at process block 262 to acquire all the image data using the prescribed pulse sequences.

Once data acquisition is complete, the reconstruction of the prescribed images begins. As indicated at process block 264, non-MEMP-RAGE images are reconstructed 264 in a manner appropriate to each. Then, the MEMP-RAGE images are reconstructed as indicated generally at loop 265.

As indicated by process block 266, the echo signals that are to be combined at each phase encoding are selected and then they are combined as indicated at process block 267. In many MRI scanners, by default the scanner will reconstruct the multiple echoes acquired using an MEMP-RAGE pulse sequence as separate volumes and create a separate DICOM series for each echo. Alternatively, the scanner can be configured to pack the multiple echoes acquired using an MEMP-RAGE pulse sequence into a single series that is still reconstructed as separate images for each echo.

Figure 7:
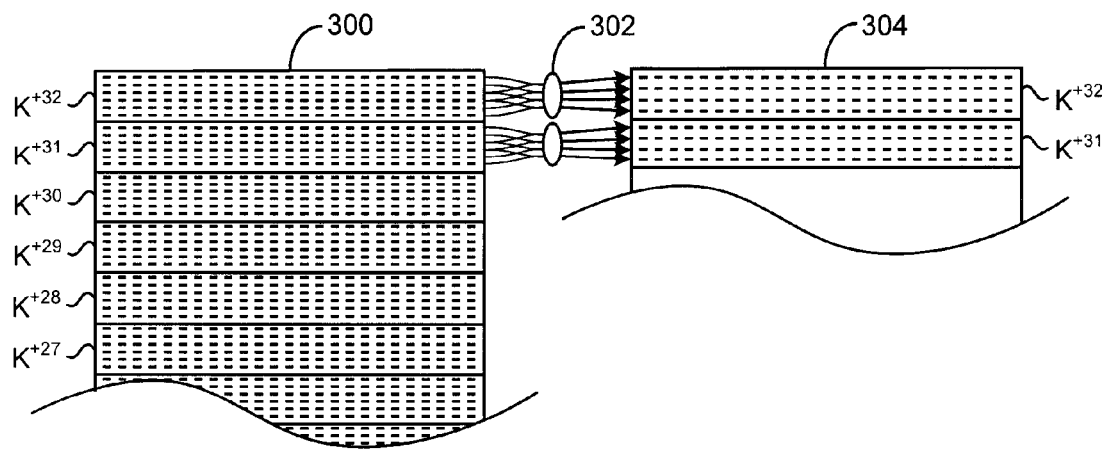
FIG. 7 is an illustration of a method of combining k-space lines in accordance with the present invention.

In particular, referring to FIG. 7, the echo signals, embodied as k-space lines, may be combined in any of a variety of ways. Specifically, selected k-space lines forming a data set 300 acquired as described with respect to FIGS. 4 and 5 may be averaged 302 to yield a reduced set of k-space data 304. However, the averaging process 302 can also be performed in object space after image reconstruction process applying a Fourier transformation using root-mean-square (RMS) averaging or linear averaging, or an operator can indicate that no averaging should be performed. In this case, process blocks 267 and 268 of FIG. 6 would switch positions. That is, reconstruction of the MEMP-RAGE image 268 would be performed at process block 268 followed by combining the selected signals at process block 267.

In either case, if RMS averaging is selected, each voxel in each echo is squared, and the mean for each voxel is calculated across echoes. The square root of the mean for each voxel is calculated and written to a new RMS volume. On the other hand, if linear averaging is selected, a weighted sum of the voxels is used to create a combined volume, and the coefficients for each echo are supplied on a special card of the user interface (UI) as an array of floating point numbers. The array appears when "Averaging" is set to "linear".

It is contemplated that other methods of combining echoes may be employed. For example, before linear averaging or calculating the RMS, the odd and even echoes could be distorted in opposite directions based on a field map that is intrinsically implied by the multi-echo data. As such, the sharp features of each echo would be preserved because the average would not result in a blur between distortions with opposite directions.

Referring again to FIG. 6, the resulting combined k-space data set is then used to reconstruct an MEMP-RAGE image as indicated at process block 268. In particular, the image reconstruction process is a conventional two-dimensional complex Fourier transformation (2DFT) followed by a magnitude calculation, as indicated above in equation (1). These images can be reconstructed from different MEMP-RAGE data acquired during the scan, but usually the same acquired MEMP-RAGE data is used and additional images are reconstructed by selecting different echo signals to combine or by combining the selected echo signals in a different manner.

A decision is then made at block 269 as to whether additional MEMP-RAGE images are to be reconstructed. If additional MEMP-RAGE images are to be reconstructed 270, the MEMP-RAGE image reconstruction process is repeated, as generally indicated by reconstruction loop 265. On the other hand, if the current MEMP-RAGE image is the last MEMP-RAGE image to be reconstructed 271, image registration is performed as indicated at process block 272.

In particular, the present invention allows the images reconstructed from data acquired using MEMP-RAGE and non-MEMP-RAGE pulse sequences to be precisely aligned, or registered, as indicated at process block 272. The registration process can be performed by even a traditional registration tool, such as FLIRT (FMRIB, Oxford) in 6-dof (rigid body) registration mode. These registered images are then displayed as indicated at 274 and the process ends at 276. As described above, the selection 266 and combining steps 268 can be used to adjust the effective $T_2$ contrast of the MEMP-RAGE image to provide the needed contrast between tissue types. By registering the images, the edges of small structures may be distinguished based on differences in more than one contrast.

The present invention has been described in terms of the preferred embodiment, and it should be appreciated that many equivalents, alternatives, variations, and modifications, aside from those expressly stated, are possible and within the scope of the invention. Therefore, the invention should not be limited to a particular described embodiment.

We claim:

1. A method for producing an image with a magnetic resonance imaging (MRI) system, the steps comprising:
    a) performing a preparatory pulse sequence with the MRI system in which an RF excitation pulse is produced and a time period (TI) elapses during which longitudinal spin magnetization recovers;
    b) performing an imaging pulse sequence with the MRI system when the TI elapses in which another RF excitation pulse is generated to produce transverse spin magnetization, in which a single phase encoding pulse is generated, and in which a series of gradient-recalled NMR signals are acquired;
    c) repeating step b) a plurality of times at each of a plurality of different phase encoding pulse values; and
    d) reconstructing an image using the acquired NMR signals by selectively combining a plurality of acquired NMR signals at each of the phase encoding pulse values, and Fourier transforming the combined NMR signals.

2. The method of claim 1 wherein the imaging pulse sequence is $T_2^*$-weighted and wherein the step of reconstructing includes segmenting fat and dura in a brain of the patient.

3. The method of claim 1 wherein step b) includes alternating a polarity of a readout gradient to generate the multiple gradient echo pulses associated with each RF excitation pulse.

4. The method of claim 1 wherein step a) includes acquiring NMR data at a selected bandwidth and wherein step b) includes acquiring the series of gradient-recalled NMR signals at the selected bandwidth for each of a plurality of different phase encoding values.

5. The method of claim 1 wherein step b) includes enabling an operator to select the number of NMR signals acquired in each imaging pulse sequence.

6. The method of claim 1 wherein step d) includes enabling an operator to select which of the series of gradient-recalled NMR signals to combine in step d).

7. The method of claim 1 wherein step d) includes selectively combining the plurality of acquired NMR signals by combining signals associated with at least one of adjacent and alternating echoes in the series of gradient-recalled NMR signals.

8. The method of claim 1 wherein step d) includes combining signals associated with alternating echoes by averaging according to at least one of root-mean-square (RMS) averaging and linear averaging.

9. A method for conducting a scan with a magnetic resonance imaging (MRI) system, the steps comprising:
    a) acquiring NMR data for a first image using a first pulse that directs the MRI system to acquire NMR data at a selected bandwidth;
    b) acquiring NMR data using a MEMP-RAGE pulse sequence comprised of a preparatory pulse sequence and an imaging pulse sequence, the imaging pulse sequence acquiring a plurality of NMR signals at the selected bandwidth for each of a plurality of different phase encoding values;
    c) selectively combining a plurality of the NMR signals at each of the plurality of phase encoding values;
    d) reconstructing a first image with the NMR data acquired in step a); and
    e) reconstructing a second image with the combined NMR signals produced in step c).

10. The method of claim 9 further comprising f) registering the first image with the second image and g) displaying the first image simultaneously with the second image.

11. The method of claim 10 wherein step c) includes enabling an operator to select which of the plurality of NMR signals to selectively combine.

12. The method of claim 10 wherein step c) includes combining adjacent NMR signals according to at least one of root-mean-square (RMS) averaging and linear averaging.

13. The method of claim 9 wherein step b) includes enabling an operator to select a number of NMR signals to be acquired in each imaging pulse sequence.

\* \* \* \* \*